United States Patent [19]
Rahman et al.

[11] Patent Number: 5,873,114
[45] Date of Patent: Feb. 16, 1999

[54] INTEGRATED PROCESSOR AND MEMORY CONTROL UNIT INCLUDING REFRESH QUEUE LOGIC FOR REFRESHING DRAM DURING IDLE CYCLES

[75] Inventors: Saba Rahman; Victor F. Andrade, both of Austin, Tex.

[73] Assignee: Advanced Micro Devices, Inc., Sunnyvale, Calif.

[21] Appl. No.: 516,832

[22] Filed: Aug. 18, 1995

[51] Int. Cl.[6] .......................... G06F 13/18; G06F 13/372; G11C 11/406
[52] U.S. Cl. ............................ 711/106; 711/167; 365/222
[58] Field of Search .................................. 395/433, 431, 395/432, 494; 365/222; 711/106, 104, 105, 167, 158

[56] References Cited

U.S. PATENT DOCUMENTS

| | | | |
|---|---|---|---|
| 4,462,073 | 7/1984 | Grondalski | 395/383 |
| 4,596,004 | 6/1986 | Kaufman | 365/233 |
| 4,695,967 | 9/1987 | Kodama et al. | 345/28 |
| 4,725,945 | 2/1988 | Kronstadt et al. | 711/106 |
| 4,918,645 | 4/1990 | Lagoy, Jr. | 711/151 |
| 4,937,791 | 6/1990 | Steele et al. | 365/230.03 |
| 4,967,397 | 10/1990 | Walck | 365/222 |
| 5,175,835 | 12/1992 | Beighe et al. | 711/212 |
| 5,265,231 | 11/1993 | Nuwayser | 711/106 |
| 5,274,796 | 12/1993 | Conner | 395/551 |
| 5,307,320 | 5/1994 | Farrer et al. | 365/230.01 |
| 5,325,513 | 6/1994 | Tanaka et al. | 395/500 |
| 5,335,336 | 8/1994 | Kametani | 711/106 |
| 5,353,423 | 10/1994 | Hamid et al. | 711/143 |
| 5,379,384 | 1/1995 | Solomon | 395/308 |
| 5,384,750 | 1/1995 | Lee | 365/233 |
| 5,392,407 | 2/1995 | Heil et al. | 395/293 |
| 5,396,602 | 3/1995 | Amini et al. | 395/293 |
| 5,479,647 | 12/1995 | Harness et al. | 395/552 |
| 5,500,827 | 3/1996 | Yazdy et al. | 365/222 |
| 5,548,250 | 8/1996 | Fang | 331/14 |
| 5,557,757 | 9/1996 | Gephardt et al. | 395/306 |
| 5,651,131 | 7/1997 | Chesley | 711/106 |

FOREIGN PATENT DOCUMENTS

| | | |
|---|---|---|
| A 344886 | 12/1989 | European Pat. Off. . |
| 2234610 | 6/1991 | United Kingdom . |
| 2261537 | 11/1991 | United Kingdom . |

OTHER PUBLICATIONS

IBM Technical Disclosure Bulletin, "Bus Controller Synchronization," vol. 32, No. 6B, Nov. 1989, pp. 452–453.

Dartford, Kent, GB, Technology Graphics, "Graphics Demand New Personal Computer Bus," May 26, 1993, No. 5, pp. 18–20.

W. Hofacker, "Memory, I/O Timer Array, SY6530, Microprocessor Products," Microcomputer Hardware Handbook, ELCOMP Publishing, 1982, pp. 755–766.

Primary Examiner—Glenn Gossage
Attorney, Agent, or Firm—Conley, Rose & Tayon; B. Noel Kivlin

[57] ABSTRACT

An integrated processor is provided with a memory control unit having refresh queue logic for refreshing dynamic random access memory (DRAM) banks during idle memory cycles. The refresh queue logic includes a queue counter and allows the refresh requests to be given a lower priority than other memory transactions until the required refresh rate is in danger of being violated. At this lower priority the refresh requests are honored and retired from a refresh queue only in the absence of other memory transactions. In the event that the refresh queue becomes full, top priority is given to the execution of a refresh request. In this case, a refresh request is honored and retired from the queue immediately after the conclusion of the current memory transaction. This queuing mechanism allows the refresh requests to be buffered until idle memory cycles are available or until absolutely necessary to prevent the violation of refresh timing constraints.

8 Claims, 9 Drawing Sheets

INTEGRATED PROCESSOR AND MEMORY CONTROL UNIT INCLUDING REFRESH QUEUE LOGIC FOR REFRESHING DRAM DURING IDLE CYCLES

BACKGROUND OF THE INVENTION

FIELD OF THE INVENTION

The present invention relates generally to the operation of system memory in a personal computer (PC) system. More particularly, this invention relates to a memory controller unit for controlling the refreshing of dynamic random access memory (DRAM) chips, which comprise the system memory. Still more particularly, the present invention relates to a DRAM refresh logic which enhances system performance by performing refresh cycles primarily when the memory bus is idle.

Figure 1:
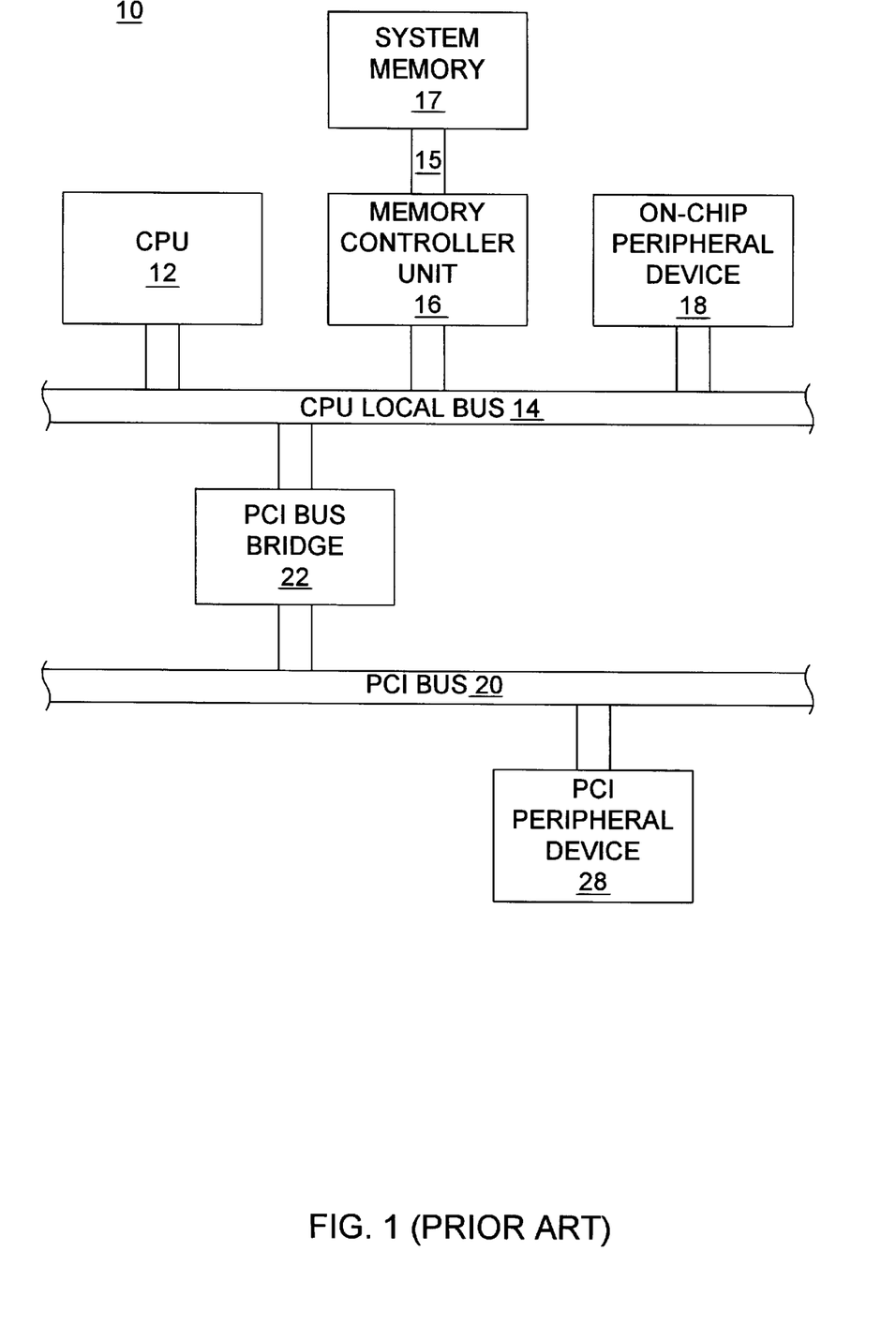
FIG. 1 depicts a functional block diagram of a prior art computer system that supports a PCI peripheral device.

FIG. 1 is a block diagram of a prior art computer system 10 that comprises a microprocessor or central processing unit ("CPU") 12, a CPU local bus 14 coupled to the CPU 12 and to a memory controller unit (MCU) 16, and a local bus peripheral device 18 also coupled to the CPU local bus 14. A system memory 17 is shown coupled to the memory controller 16 through a memory bus 15. In addition, a PCI (peripheral component interconnect) standard bus 20 is coupled to the CPU local bus 14 through a PCI bus bridge 22. A PCI peripheral device 28 is shown coupled to the PCI bus 20. The PCI peripheral device 28 may comprise a PCI Master controller that is capable of asserting ownership of the PCI bus during PCI Master cycles.

The microprocessor 12 shown in FIG. 1 may comprise a model 80486 microprocessor, and the CPU local bus 14 could comprise an 80486-style local bus. Alternatively, the processor 12 may comprise a Pentium-compatible processor, or some other processor design. The CPU local bus 14 includes a set of data lines D[31:0], a set of address lines A[31:0], and a set of control lines (not specifically shown). While the data and address lines are shown as 32-bit busses, one skilled in the art will understand that other bus widths could be used. Details regarding the various bus cycles and protocols of the 80486 CPU local bus 14 are not discussed in detail herein, as they are well known by those in the art, and are available in numerous publications. CPU 12, memory controller 16 and PCI bus bridge 22 have traditionally been fabricated on separate integrated circuit chips. A recent trend in computer systems has developed, however, in which the CPU core is combined with a variety of peripheral devices on a single integrated processor chip. An exemplary integrated processor chip includes a bus bridge that provides a high performance interface between an internal CPU local bus and an external PCI bus. By providing a high performance interface to an external PCI bus, relatively high performance characteristics can be achieved with respect to external data transfers.

The PCI bus bridge 22 provides a standard interface between the CPU local bus 14 and the PCI bus 20. As such, the PCI bus bridge 22 orchestrates the transfer of data, address, and control signals between the two buses. PCI bus 20 typically comprises a high performance peripheral bus that includes multiplexed data/address lines, and which supports burst-mode data transfers.

As noted, the PCI peripheral device 28 may comprise a PCI Master controller. In accordance with conventional techniques, the PCI Master may request "ownership" of the PCI bus, so that it can control transactions on the PCI bus 20. As one skilled in the art will understand, a plurality of PCI Masters may be included in the computer system, any of which may request ownership of the PCI bus 20. The PCI Master submits its request for ownership of the PCI bus 20 to the PCI bridge 22 on a control line in the PCI bus 20. The PCI bus bridge 22 typically arbitrates ownership requests among the various PCI Masters, and among the internal masters such as the CPU 12, and other internal masters. A priority ranking may be assigned to each of the various Masters to assist the bus bridge 22 in its priority determination.

The system memory typically includes banks of dynamic random access memory (DRAM) circuits. The DRAM connects to the MCU 16 via a memory bus 15, comprised of memory address lines, memory data lines, and various control lines. The DRAM banks, according to normal convention, comprises the working memory of the integrated processor. Data generally is transferred between DRAM 17 and other components in a computer system in two steps.

First, the accessing component generates signals on the address bus representing the row address of the desired memory location, which are latched into the DRAM when the row address strobe (RAS) signal is asserted low. At the next, or at subsequent, clock cycles, the memory device latches in the column address signal when the column address strobe (CAS) is asserted low. During an early write transaction, data is written into memory on the falling edge of the CAS signal while $\overline{WE}$ is active. In a read cycle, data from the selected memory cell is driven onto the data output line shortly after the assertion of the CAS signal while $\overline{WE}$ is inactive.

The speed of memory circuits is based upon two timing parameters. The first parameter is memory access time, which is the minimum time required by the memory circuit to set up a memory address and produce or capture data on or from the data bus. The second parameter is the memory cycle time, which is the minimum time required between two consecutive accesses to the memory circuit. For DRAM circuits, the cycle time typically is approximately twice the access time. DRAM circuits general have an access time in the approximate range of 60–100 nanoseconds, with cycle times of 120–200 nanoseconds. The extra time required for consecutive memory accesses in a DRAM circuit is necessary because the internal memory circuits require additional time to recharge (or "precharge") to accurately produce data signals. Thus, a microprocessor running at 10 MHz cannot execute two memory accesses, in immediate succession (or in adjacent clock pulses), to the same 100 nanosecond DRAM chip, despite the fact that a clock pulse in such a microprocessor is generated every 100 nanoseconds. Typically, the memory controller unit ("MCU") functions to regulate accesses to the DRAM main memory.

Because of these limitations, memory constructed with DRAM circuits is not always capable of responding to memory accesses within the time interval allotted by the central processing unit ("CPU"). In this event, external circuitry must signal to the CPU that supplementary processor cycles, or wait states, are necessary before the data is ready on the data bus, or before data from the data bus has been stored by the memory circuits. In addition to slowing the processing of the CPU, wait states generally require use of the CPU local bus, thereby limiting access to the bus by other system circuitry.

In addition to the delays caused by access and cycle times, DRAM devices are inherently dynamic devices which require periodic refresh cycles to protect the integrity of the stored data. These cycles consume a significant portion of the time available for memory accesses, and typically are required approximately every 4 milliseconds. If the DRAM circuit is not refreshed periodically, the data stored in the DRAM circuit will be lost.

Most industry standard DRAM devices have 256 rows. All of these rows must be refreshed once every 4 milliseconds, requiring refresh cycles to be run every 16 microseconds to complete the 256 refresh cycles in 4 milliseconds. In addition, system memory typically includes a plurality of DRAM banks. It has become increasing common to have the memory sub-system in a personal computer system support four or more banks of DRAM devices. While some computer systems have attempted to refresh all of the available DRAM banks at one time, the power consumed in such a DRAM refresh may be excessive, especially in portable systems that are battery operated.

As a result, most computer systems stagger the refresh cycles for each DRAM bank due to power considerations. Thus, refresh cycles are run sequentially to each of the DRAM banks provided in the system memory, consuming even more of the available memory access time. As an example, for a 4 bank DRAM memory sub-system with 256 rows, a refresh cycle may be required every 4 microseconds to meet the 4 millisecond refresh rate for each line in each bank of DRAM. This brings the refresh overhead to approximately 5% of the available memory bandwidth. A system with more than 4 banks of DRAM has an even higher refresh overhead, leaving less of a bandwidth available for the processor to access system memory, and thus increasing the frequency of wait states for the processor.

As the operating speed of processors increases and as new generations of processors evolve, it is advantageous to minimize wait states to fully exploit the capabilities of these new processors obtaining the maximum benefit of these new generations of high speed processors in personal computers, however, is especially difficult, because of size and power limitations of other components in the system, such as the DRAM system memory. With memory intensive applications, such as those involving technical or scientific calculations or computer aided design programs, the memory access time can greatly reduce the system performance.

SUMMARY OF THE INVENTION

The present invention solves the shortcomings and deficiencies of the prior art by providing a memory control unit (MCU) that is designed to run refresh cycles on DRAM banks during periods when the memory bank is idle, to minimize wait states for the CPU and other bus master devices. The present invention assigns a lower priority to refresh cycles than other memory transactions until the required refresh rate is in danger of being violated. At that time, the refresh cycle is prioritized to begin at the completion of the present memory cycle.

The memory control unit of the present invention includes a DRAM controller for controlling transactions to the DRAM banks. When DRAM bus requests are received, the DRAM controller processes the requests to determine the manner in which the transaction should be completed. The DRAM controller provides control signals to a DRAM edge generator, which generates the RAS, CAS, and other control signals that are used to coordinate memory transactions. The MCU also preferably includes a refresh and queue logic for providing signals to the DRAM edge generator to control the refreshing of the DRAM banks. According to the preferred embodiment, the refresh is implemented by the assertion of the CAS signal before the RAS signal by the edge generator.

The refresh and queue logic determines when the refresh should be asserted based upon the activity level of the memory bus and the time since the previous refresh. The refresh and queue logic also determines which bank of DRAM to refresh. The refresh and queue logic sequentially refreshes the available banks of DRAM, and includes a refresh bank pointer to keep track of the DRAM bank to be refreshed. The refresh bank pointer provides an output signal to a bank detect logic to indicate the DRAM bank to be serviced.

The refresh and queue logic periodically receives a refresh request signal at a preset frequency. The refresh request signal is used to increment the count of an up/down queue counter, which implements the queue of the present invention. Prior to the time that the counter becomes full, a refresh cycle is only initiated when the memory bank is idle. When the counter becomes full, a refresh is initiated at the conclusion of the present memory transaction, if any.

The present invention preferably includes configuration registers for indicating the number of DRAM banks that are populated in the DRAM array. The configuration registers also preferably provide a divisor for the refresh request timer. In the preferred embodiment, the refresh request is generated by an external timer, which operates at 256 kHz to provide a refresh request once each 4 microseconds.

The DRAM controller provides an indication to the refresh and queue logic of when the memory bus is idle, and when a current memory cycle or refresh cycle has been completed. The DRAM controller receives an indication when a refresh cycle has been initiated by the refresh and queue logic to prevent other memory transactions from being initiated until refresh cycle is complete.

In an exemplary embodiment, the present invention comprises an integrated processor that includes a memory control unit (MCU) which dynamically controls refresh cycles to the DRAM bank array. The memory control unit includes a refresh and queue logic which includes a counter for monitoring the required refresh rates. Prior to the time that the counter is full, refresh is only initiated if the memory bus is not currently in use, such as may occur during an input/output cycle, or other system event not requiring system memory access. Consequently, memory transactions can occur without interruption until the critical refresh rate is close to expiring.

The memory control unit connects to a CPU core and to other integrated processor components via a CPU local bus system. The memory controller unit includes a bus arbiter for receiving an ADS signal denoting a local bus cycle, and an address decoder for determining if an address request is made to DRAM. A DRAM router receives the address signal from the local bus and routes the address to a DRAM address multiplexer. The DRAM router also provides a Bank select signal and a Byte select to the DRAM edge generator to identify which RAS and CAS lines to assert. The DRAM controller provides an indication to the DRAM edge generator of the start of a precharge cycle and the end of the cycle, from which the DRAM edge generator determines if the transaction is a lead-off cycle, or a cycle after a DRAM page has been opened already (i.e., a burst mode).

BRIEF DESCRIPTION OF THE DRAWINGS

For a more detailed description of the preferred embodiment of the present invention, reference will now be made to the accompanying drawings, wherein.

While the invention is susceptible to various modifications and alternative forms, specific embodiments thereof are shown by way of example in the drawings and will be described in detail herein. It should be understood, however, that the drawings and detailed description are not intended to limit the invention to the particular form disclosed. On the contrary, the intention is to cover all modifications, equivalents and alternatives falling within the spirit and scope of the present invention as defined by the appended claims.

DETAILED DESCRIPTION OF THE INVENTION

The following discussion focuses on the preferred construction of the memory control unit ("MCU") 100, which in the preferred embodiment forms part of an integrated processor, in accordance with the general design of FIG. 1. Additional details regarding the preferred integrated processor design may be found in commonly assigned U.S. Pat. No. 5,557,757 entitled "High Performance Integrated processor Architecture Including A sub-bus control Unit For Generating Signals to control A Secondary Non-multiplexed External Bus," the teachings of which are incorporated herein. Moreover, the following discussion regarding the MCU 100 is focused on those components that relate to the operation of the refresh and queue logic so as not to obscure the present invention. Other components may be provided as part of the MCU without departing from the present invention.

Figure 5:
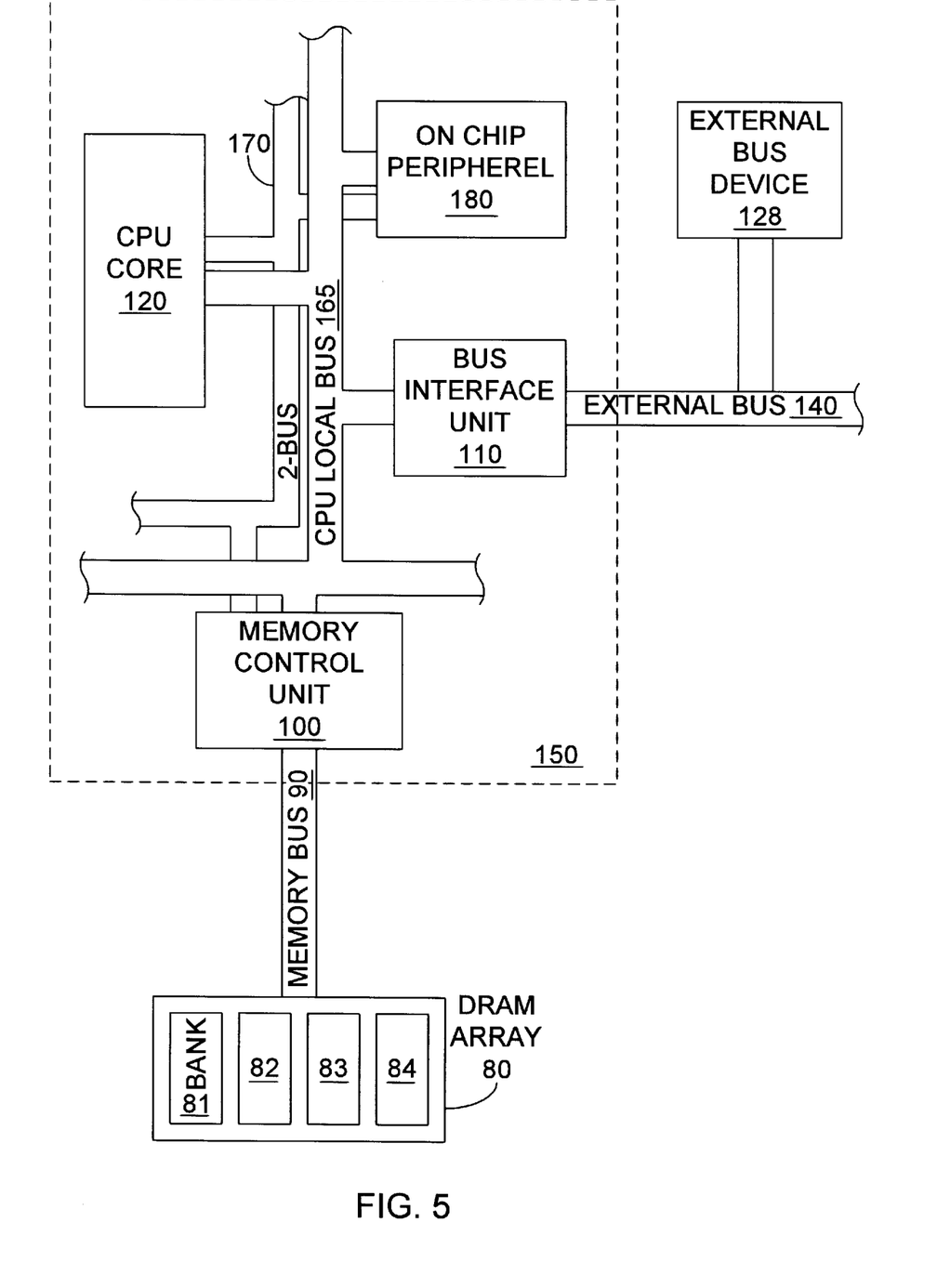
FIG. 5 depicts a general layout of the integrated processor constructed in accordance with the preferred embodiment.

In the preferred embodiment of FIG. 5, the MCU 100 is provided as part of an integrated processor 150, and coupled to the CPU local bus 165 and/or to local internal buses, such as an 8-bit Z-bus 170. It should be understood, however, that the MCU 100 of the present invention could be located independently of the processor. In that case, the internal buses would be replaced by a suitable host bus. In the preferred embodiment, the CPU core 120 implements a model 80486 microprocessor instruction set and the CPU local bus 165 comprises a model 80486-style local bus. Thus, in the preferred embodiment, the CPU local bus 165 includes a 32-bit set of data lines D(31:0), a 32-bit set of address lines A(31:0), and a set of control lines (not shown specifically). Once again, however, it should be understood that the CPU core could be configured to implement other microprocessor-type instruction sets, such as a Pentium compatible instruction set, without departing from the principles of the present invention. Similarly, local bus 165 could be designed according to any of a number of protocols, including a Pentium compatible protocol.

The integrated processor 150 also preferably includes a bus interface unit 110 and an on chip peripheral device 180. The integrated processor 150 preferably connects to one or more external devices 128 via external bus 140. In accordance with the preferred embodiment, the bus interface unit 110 orchestrates the transfer of signals between the local bus 165 and the external bus 140. The external bus 140 may be configured in accordance with any of a number of conventional computer bus protocols, including a PCI (peripheral component interconnect) bus, an ISA (industry standard architecture) bus, or an EISA (extended industry standard architecture) bus.

The MCU 100 controls memory transactions to the DRAM memory array 80, which preferably is comprised of four banks of DRAM circuits, 81, 82, 83, 84. The MCU 100 connects to the DRAM memory array 80 via memory bus 90. The memory bus preferably includes a set of address, data and control lines, in accordance with conventional practices.

Figure 2:
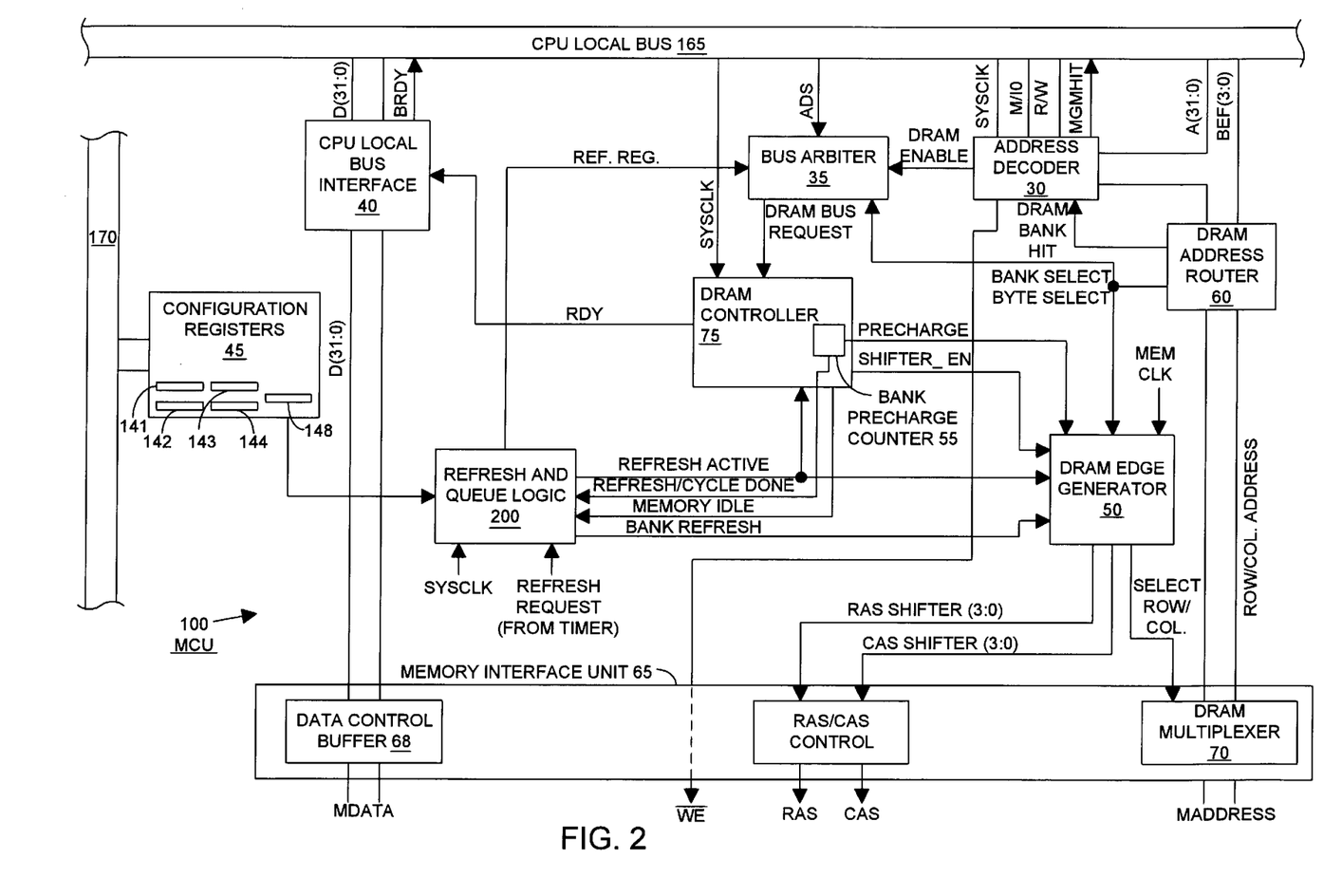
FIG. 2 depicts a functional block diagram of the memory control unit constructed in accordance with the preferred embodiment.

Referring now to FIGS. 2 and 5, the general configuration of the MCU 100 is shown in block diagram form connected to the CPU local bus 165 and to the 8-bit Z bus 170, in accordance with the preferred embodiment. The MCU 100 preferably comprises a unified control unit which supports a high performance address and data path to the DRAM array 80, as shown in FIG. 5. The MCU 100 controls access to the DRAM array 80 and connects to the CPU local bus 165 to provide a path to RAM for the CPU, and other peripheral components. The memory control unit 100 connects to the DRAM array through the memory bus 90.

With continued reference to FIG. 2, FIG. 5 shows a memory bus 90 which preferably comprises the memory address lines (MAddress), the memory data lines (MData), and various control lines including RAS, CAS, and write enable $\overline{WE}$. The DRAM array 80 comprises the main working memory of the CPU 120, in accordance with normal convention. The DRAM array 80 preferably comprises DRAM circuits configured into a plurality of banks 81, 82, 83, 84, with each bank 32 bits (or 4 bytes) wide. In the preferred embodiment, the DRAM array 80 accommodates as many as four 32-bit banks supporting up to 256 MB of RAM using Industry standard modules. As will be understood by one skilled in the art, each of the DRAM banks typically are sub-divided into "pages." The page size depends upon the size of the respective DRAM chips that are used. To enable the DRAM chips to operate with fewer connector pins, which decreases the number of chips that can be located on the system board, the DRAM chips are addressed in a multiplexed fashion; that is the address of each memory cell is transmitted in two phases. The first phase of the address cycle defines the row address and the second phase defines the column address. In the preferred embodiment, the first twelve lines of the memory address bus MA(11:0) are multiplexed outputs and convey the row address location when row address strobe signals (RAS) are transmitted, and convey the column address location when column address strobe signals (CAS) are transmitted. An individual memory cell in DRAM, therefore, is selected by a row address and a column address which are transmitted separately to the DRAM array.

Referring still to FIG. 2, the MCU 100 preferably includes an address decoder 30, an address router 60 and a DRAM multiplexer 70 (which forms part of a memory interface unit 65) for controlling the manner in which the address A(31:0) from the local bus 165 is provided on the memory address bus MAddress. The MCU 100 also preferably includes a bus arbiter unit 35 for initiating memory transactions, and a CPU local bus interface 40 for controlling the transfer of data D(31:0) between the local bus 165 and the memory data bus MData. In addition, the MCU 100 also preferably includes a DRAM controller 75 for orchestrating the operation of the MCU during a DRAM transaction, configuration control logic 45, a DRAM edge generator 50, and a refresh and queue logic 200.

The address decoder 30 preferably connects to the CPU local bus 165 to receive address signals and control signals such as read/write signals R/W, memory or I/O cycle status signals. The address decoder 30 also receives a system clock (SysClk) signal to control its timing. The address decoder 30 receives an input signal from the DRAM router indicating if a DRAM bank hit occurs, and in turn produces a MEMHIT output signal to the local bus 165, and a DRAM enable signal to the bus arbiter 35. The address decoder 30 also produces an output signal to the memory interface unit 65 to control the write enable $\overline{WE}$ control signal.

In accordance with the preferred embodiment, the DRAM address router 60 couples to the address lines A(31:0) of the CPU local bus 165 and provides row and column address signals to the DRAM multiplexer 70. The DRAM address router 60 also provides as an output signal to the DRAM edge generator 50 a bank select signal and a byte select signal to indicate to the edge generator 50 which row address strobe (RAS) line RAS(3:0) and which column address strobe (CAS) line CAS(3:0) to assert to complete the memory transaction.

The DRAM multiplexer 70 preferably receives the row and column addresses from the address router 60 and multiplexes these addresses to first provide the row address on the memory address lines MAddress (11:0), and then to provide the column address on the same memory address lines. The selection and timing of the column address is determined by an input signal received from the DRAM edge generator 50.

The bus arbiter 35 receives an ADS signal from the CPU local bus 165 to indicate the beginning of a cycle. In addition, the bus arbiter 35 preferably receives a signal from the DRAM router 60 indicating whether the next memory access is on the same bank or page as the previous access. The bank and page information preferably are transmitted by the bus arbiter 35 to the DRAM controller 75 as part of a DRAM bus request. As shown in the exemplary embodiment of FIG. 2, the bus arbiter 35 may also receive a refresh request from the refresh and queue logic 200 and may transmit this request to the DRAM controller 75 as part of a DRAM bus request.

The CPU local bus interface 40 connects to the CPU local bus 165 to receive and transmit data signals D(31:0) to and from the CPU local bus 165. Similarly, the local bus interface 40 preferably connects to the memory data bus MDATA(31:0) through a separate data control buffer 68 to transmit and receive data signals to and from the DRAM array. The direction in which the data signals are driven preferably is controlled by a read/write (R/W) control signal from the address decoder 30. The CPU local bus interface 40 preferably is enabled by control signals from the DRAM controller 75. As one skilled in the art will understand, the CPU local bus interface 40 and the data control buffer 68 may be constructed as a single unit, if desired.

Referring still to FIG. 2, the DRAM controller 75 preferably receives control signals from the bus arbiter 35 to indicate that a data transaction to DRAM is requested. After receiving the control signals from the bus arbiter 35, the DRAM controller generates a ready RDY signal to the CPU local bus interface 40 and a shifter enable signal to the DRAM edge generator 50. In the exemplary embodiment of FIG. 2, the DRAM controller 75 receives an indication from the refresh and queue logic 200 indicating when a refresh cycle is active. The DRAM controller 75 preferably includes a state machine for resolving when the memory bank is idle, and produces a signal such as Memory Idle representing the status of the memory bus.

The DRAM controller 75 preferably includes a bank precharge counter 55, which comprises a down counter, clocked by the system clock (SysClk) signal, which determines the precharge period. The bank precharge circuit 55 begins counting down when shifter enable output signals are transmitted by the DRAM controller 75. In the preferred embodiment, the precharge period is determined by appropriate registers in the configuration control logic 45 (depending upon whether a RAS precharge or a CAS precharge is occurring). At the beginning of the count, the bank precharge circuit 55 also provides an output signal to the DRAM edge generator 50 to indicate the start of a precharge period to indicate to the DRAM edge generator 50 that the previous memory transaction is complete. At the completion of the count, a signal also is generated by precharge circuit to indicate that the DRAM circuit cycle time has been met and the next transaction can begin.

Each of the above identified components of the MCU 100 are clocked with the system clock (SysClk) signal. The DRAM edge generator 50, however, preferably is clocked with a MemClk signal that operates at a frequency which is a multiple of the SysClk signal. In the preferred embodiment, the MemClk operates at twice the frequency of the SysClk signal. In addition, both edges of the MemClk signal are used by the DRAM edge generator 50 to effectively provide a four-fold increase in resolution.

The configuration control logic 45 preferably includes several configuration registers. The values in these configuration registers preferably are established during system initialization by the basic input/output system (BIOS). In the preferred embodiment, each DRAM bank has a dedicated configuration register (four are shown as 141, 142, 143, 144) to indicate if the bank is populated, and, if so, to indicate the size and type of DRAM device used. In addition, the configuration control logic preferably includes a MCU control register 148, with dedicated bits to indicate the type of refresh to be implemented. Thus, for example, three bits may be dedicated in the MCU Control Register to indicate the refresh rate (such as 62.5 microseconds or 125 microseconds), among other parameters associated with refresh (self refresh or standard refresh). In accordance with the preferred embodiment, the register 141 is identified as DBC1L, with an index of 63H, and comprises an eight bit register, with bit 0–4 dedicated for indicating whether the DRAM bank is populated, and the size of DRAM in bank 81 (FIG. 5). DRAM bank configuration register 142 similarly is identified as DBC2L, with an index of 65H; DRAM bank configuration register 143 is identified as DBC3L, with an index of 67H; and DRAM bank configuration register 144 is identified as DBC4L, with an index of 69H. MCU control register 148 preferably is identified as MCR, with an index of 6 CH.

Referring still to FIG. 2, the refresh and queue logic 200 preferably receives signals indicative of the contents of configuration registers 141, 142, 143, 144, and 148 to establish whether each of the DRAM banks are populated, and also to indicate the type of refresh to be implemented, as predetermined by the system BIOS. The refresh and queue logic 200 also receives signals from the DRAM controller 75 indicating that the current memory transaction cycle or refresh cycle is done, and the status of the memory bus. In response to receipt of these signals, and during appropriate intervals, the refresh and queue logic 200 issues signals to the DRAM edge generator 50 indicating that refresh is active, and indicating which bank of DRAM to refresh. The DRAM edge generator then generates the appropriate refresh sequence (such as CAS before RAS) to perform a refresh cycle on the specified DRAM bank.

In accordance with customary techniques, the row address strobe (RAS) lines (RAS3#–RAS0#) preferably comprise active low outputs that are used by the DRAM array to clock in row address data from the memory address bus MADDRESS(11:0) for each DRAM bank. In the preferred embodiment, one RAS line is dedicated to each bank. Four RAS lines are provided in the preferred embodiment where four RAM banks are used. Similarly, four column address strobe (CAS) lines (CAS3#–CAS0#) are provided as active low outputs that are used by the DRAM array to clock in column address data from the memory address bus MADDRESS(11:0) for each byte of the DRAM bytes, one CAS per byte. Thus, for example, CAS3# is the DRAM column address strobe for byte 3 in each DRAM bank. According to the protocol of the preferred embodiment, to perform a refresh cycle to bank 3, all of the CAS lines are asserted low, and then the RAS3# is asserted low for a predetermined period (defined by the number of lines in the DRAM to perform the refresh.

Figure 6:
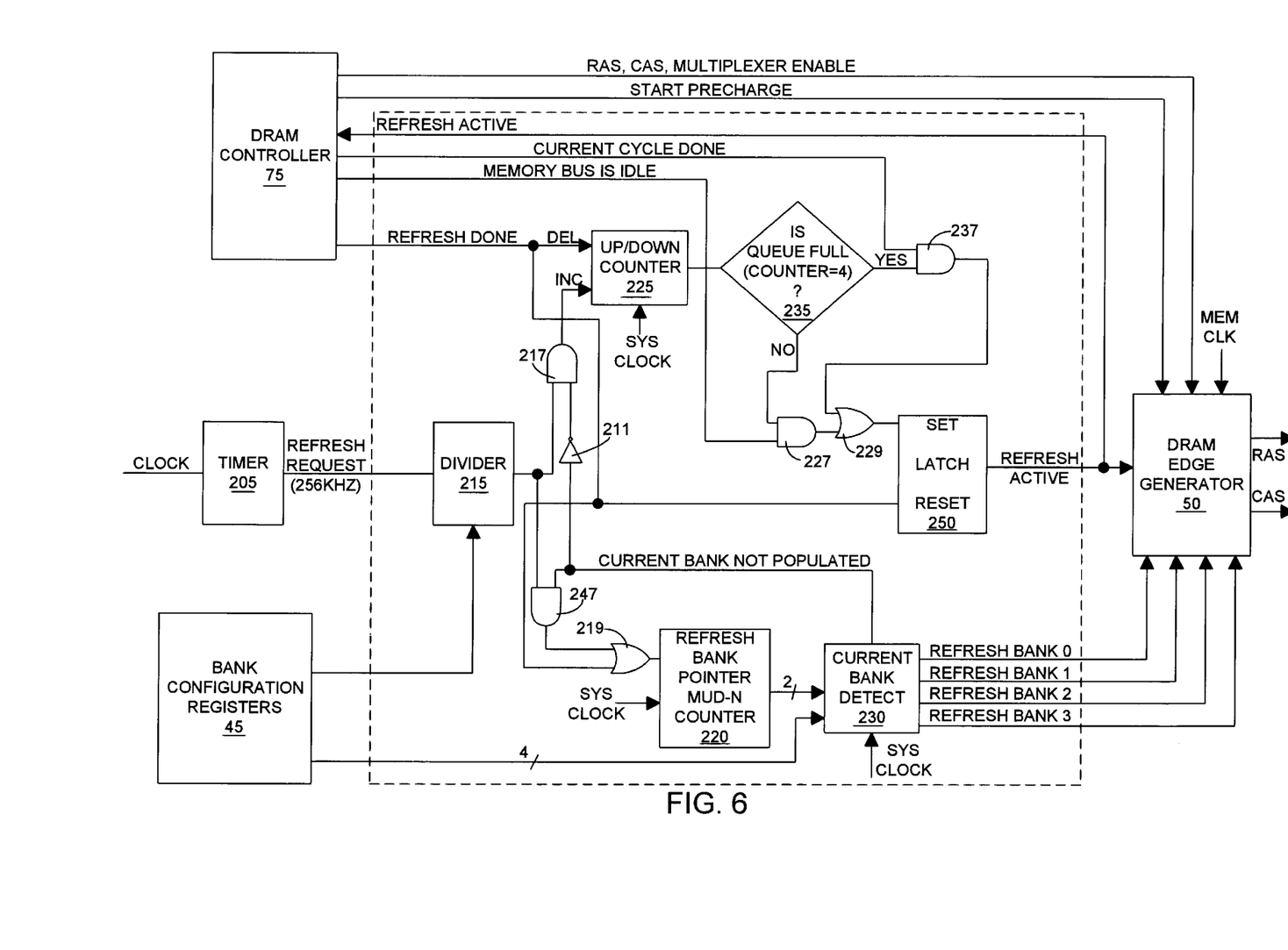
FIG. 6 is a block diagram depicting the preferred construction of the refresh and queue logic of FIG. 2.

The preferred construction of the DRAM refresh and queue logic 200 now will be described with reference to FIG. 6. FIG. 6 illustrates the preferred construction of a logic device to provide the refresh active and bank selection signals to initiate a refresh cycle. As shown in FIG. 6, the refresh and queue logic 200 preferably includes a clock divider 215, an up/down counter 225, a refresh bank pointer 220, a current bank detect 230, and a latch 250.

The refresh divider 215 receives a clock input signal from external timer 205, which preferably outputs a signal with a frequency of 256 kHz, to provide a clock signal approximately every 4 microseconds. The divider 215 also receives a control signal from the bank configuration register, and in particular, register 148 (FIG. 2) to indicate the power consumed by the refresh cycle. In response to the status of the control signal from the MCR register 148, divider 205 divides the 256 kHz signal by an appropriate divisor. In the preferred embodiment, the divisor is either 4 or 8 to indicate whether the refresh is a low power or medium power refresh. The output of divider 215 is provided as an input to an AND gate 217, and to AND gate 247.

The output of AND gate 217 is provided to increment up/down counter 225. The decrement input for counter 225 is obtained from the refresh done output signal from DRAM controller 75, which also is provided as the RESET input to latch 250. The up/down counter is clocked by the systcl clock, and provides an output to a comparator 235, which determines if the count of the counter is equal to the predetermined maximum value of the queue. The maximum value of the queue is predetermined to correlate to the maximum period between refresh cycles to a DRAM.

Referring still to FIG. 6, the comparator 235 preferably provides an output to AND gate 237 if the queue or count is full, or an output to AND gate 227 if the queue is not full. The other input to AND gate 237 is obtained as the current cycle done output from DRAM controller 75. The other input to AND gate 227 preferably comprises the memory bus idle indication from memory controller 75. The output lines of the AND gates 227, 237, are provide d a s inputs to OR gate 229. The output of OR gate 229 connects to the SET terminal of latch 250. The refresh done signal from the DRAM controller 75 and the output of AND gate 247 connect as inputs to OR gate 219. The output of OR gate 219 is provided to the refresh bank pointer 220.

The refresh bank pointer 200 preferably comprises a mod-N counter 220, which according to known techniques, count s from 0 to N. T he value N is selected as the queue value. In the preferred embodiment, a queue value of 4 is used as N. Thus, the counter 220 counts through a range of four values, such as 0 to 3. These four values can be digitally encoded with two bits, and thus a two line conductor is shown between counter 220 to the current bank detect 230, which provides an indication of the DRAM bank to be refreshed. The current bank detect 230 also receives configuration signals from the bank configuration resister logic 45 to indicate which DRAM banks are populated, and which are not. In response to the pointer, and the configuration signals, the current bank detect logic 230 provides an input signal to AND gate 247 to indicate if the current bank is populated. If the bank is populated, the current bank detect provides a refresh bank signal (3:0) to the DRAM edge generator 50 indicating the bank to be refreshed.

The latch 250 receives as a SET signal the output of OR gate 229. The RESET signal is provided from the refresh done output signal from DRAM controller 75. In response to receipt of an active SET signal from OR gate 229, the latch 250 provides an active refresh output, which is provided to the DRAM edge generator 50 and to the DRAM controller 75.

The operation of the refresh and queue logic 200 will now be described with reference to FIG. 6. Initially, the configuration registers in bank configuration logic 45 provide indications of which DRAM banks are populated to the current bank detect 230, and also provide a divisor for divider 215. A refresh request is provided from timer 205 to divider 215, which provides an increment signal to the counter if the current bank is populated. The comparator 235 determines if the queue counter is full. If the queue counter is not full, the refresh will only be activated if the bus is idle (as determined by AND gate 227). If the queue counter is full, the refresh cycle is initiated as soon as the current memory cycle is completed (as determined by AND gate 237). The bank to be refreshed is determined by the refresh bank counter 220 and bank detect 230. The refresh bank pointer preferably sequentially points to each DRAM bank in order. The pointer only changes at the completion of a refresh (as indicated by DRAM controller 75), or at the next output signal from divider 215 if the current bank is not populated. The pointer 220 provides an encoded binary signal indicative of the status of the pointer, to current bank detect 230. Current bank detect provides an appropriate output signal to edge generator 50 indicating the bank to be refreshed. If the current bank is not populated, current bank detect provides an output signal causing the pointer 220 to advance to the next bank.

Figure 3A:
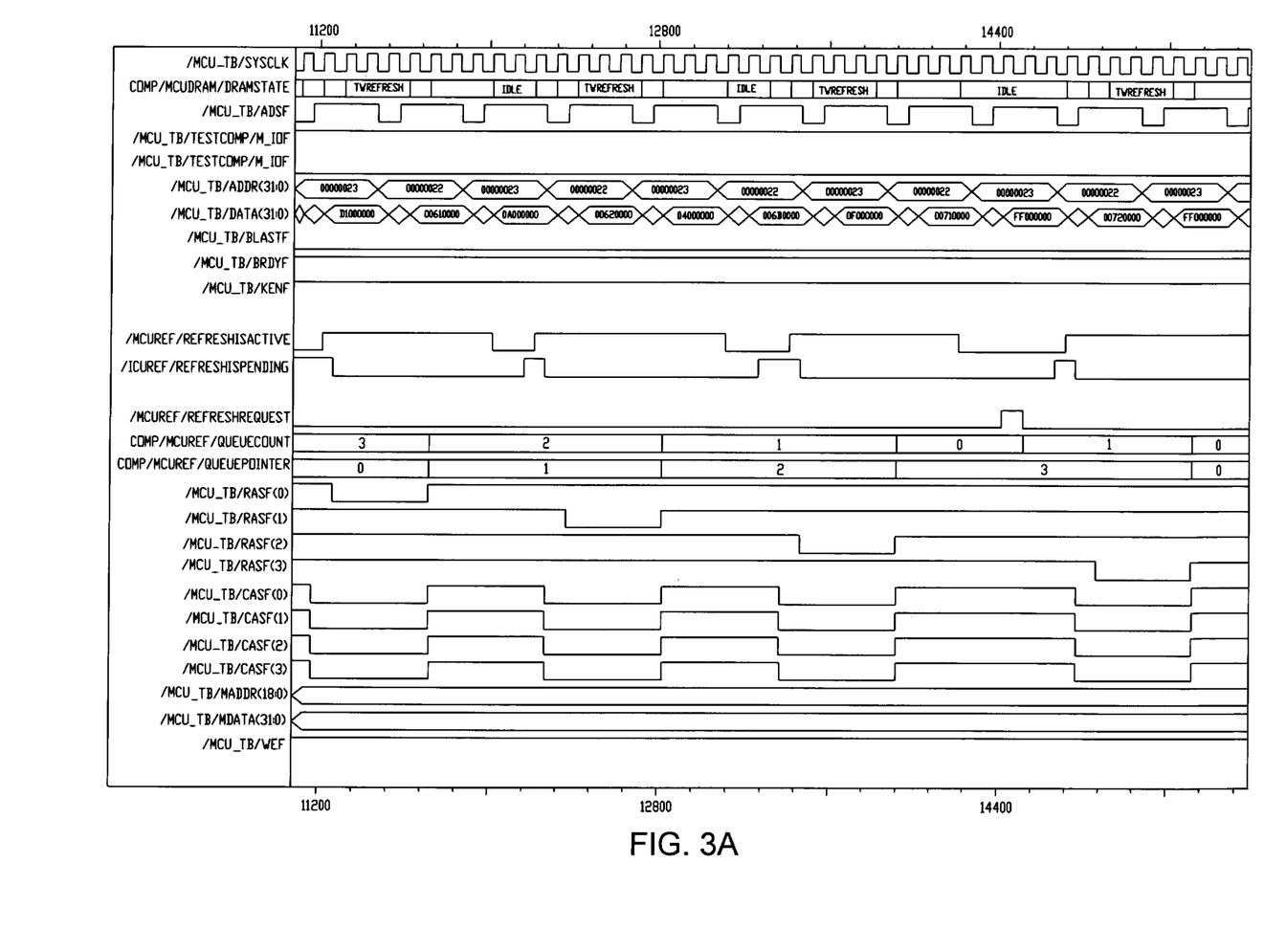
FIGS. 3A–3C are timing diagrams illustrating the operation of the MCU shown in FIG. 2, with four banks populated.

Referring now to FIGS. 3A and 6, timing of a refresh is shown for a DRAM array with four populated banks, during a period when the memory bus is idle. The queue count is shown initially at 3, with the queue pointer at bank 0. At approximately 11,200 nanoseconds, a refresh active signal appears, and substantially simultaneously therewith, a refresh cycle is begun by asserting the CAS lines low. Shortly thereafter, the RAS(0) line is asserted low, refreshing bank 0. At substantially the same time, a refresh pending signal is driven low. When the RAS line is deasserted, the queue counter is decremented to 2, and the queue pointer is changed to bank 1. Subsequently, the refresh active signal is deasserted, and the refresh pending signal is deasserted (or alternatively, a refresh done signal is asserted). Because the memory bus still is idle (no read or write assertion, no BRDY assertion) and the queue remains loaded, another refresh is initiated to bank 1 by asserting a refresh active signal, which results in the assertion of the CAS lines. Substantially simultaneously therewith, the refresh pending signal is asserted. Subsequently, RAS(1) is asserted to refresh bank 1. A similar process also occurs to refresh bank 2.

Referring still to FIG. 3A, a refresh request signal is received when the queue pointer is pointing to bank 3 and the queue count is at 0. This causes the queue count to increment to 1. Because the memory bus is still idle, a refresh cycle to bank 3 ensues.

Figure 3B:
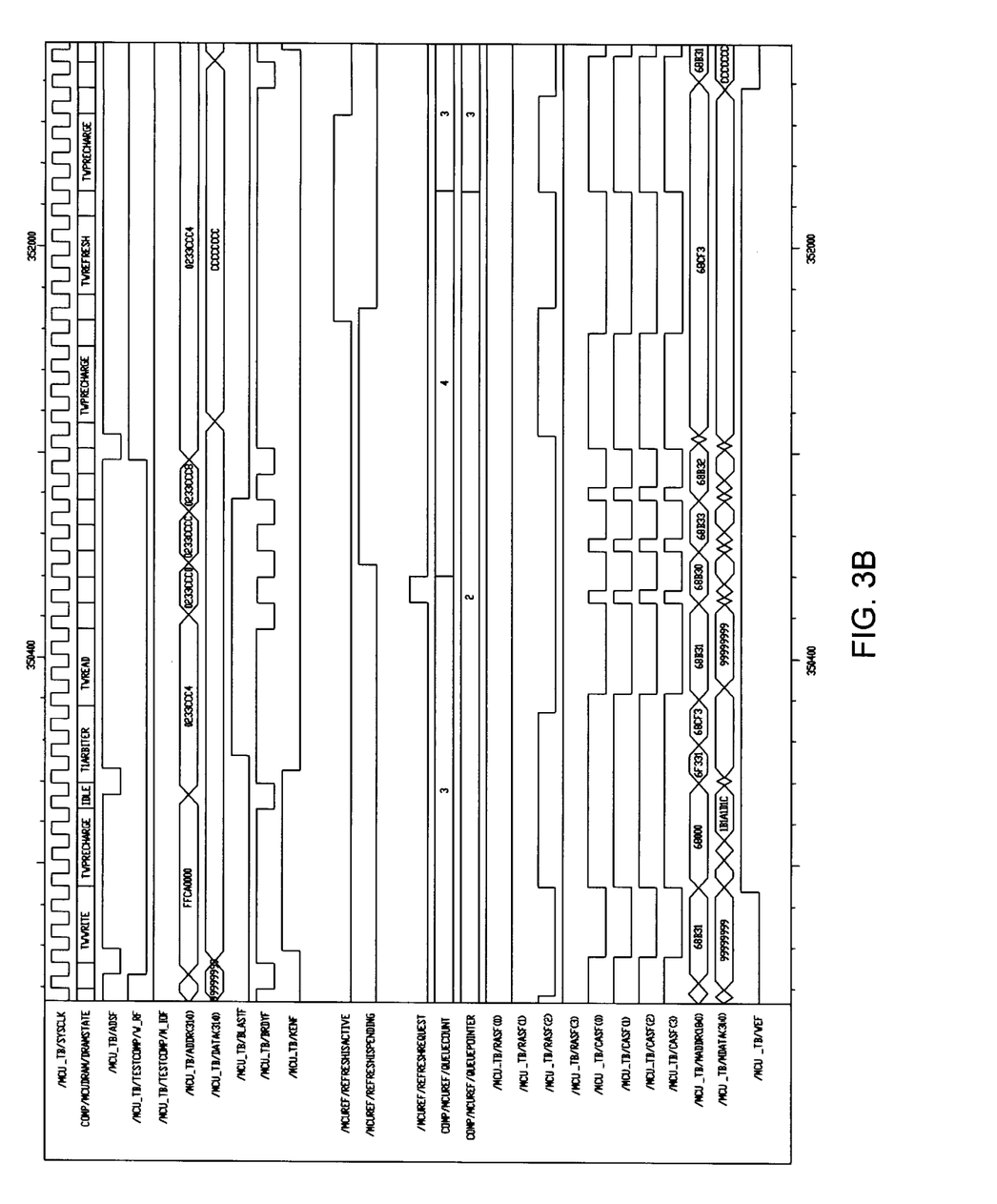

Referring now to FIG. 3B, a refresh cycle is shown for an example where the queue counter becomes full during active memory bus cycles. Initially, the queue counter is at 3, and the queue pointer is pointing to bank 2. The memory bus is engaged in a DRAM Read cycle, as shown by the status of the R/W, BRDY, BLASTF, and other signals. A refresh request is received, causing the queue to increment to 4, which in the example of FIG. 3B indicates a full queue counter. At the conclusion of the TWPRECHARGE DRAM state, the refresh active signal is asserted, and the CAS lines are asserted. Subsequently, and at substantially the same time, the RAS(2) line is asserted and the refresh pending signal is deasserted. At the deassertion of the RAS(2) line, the queue counter is decremented to 3, and the queue pointer is indexed to 3.

Figure 3C:
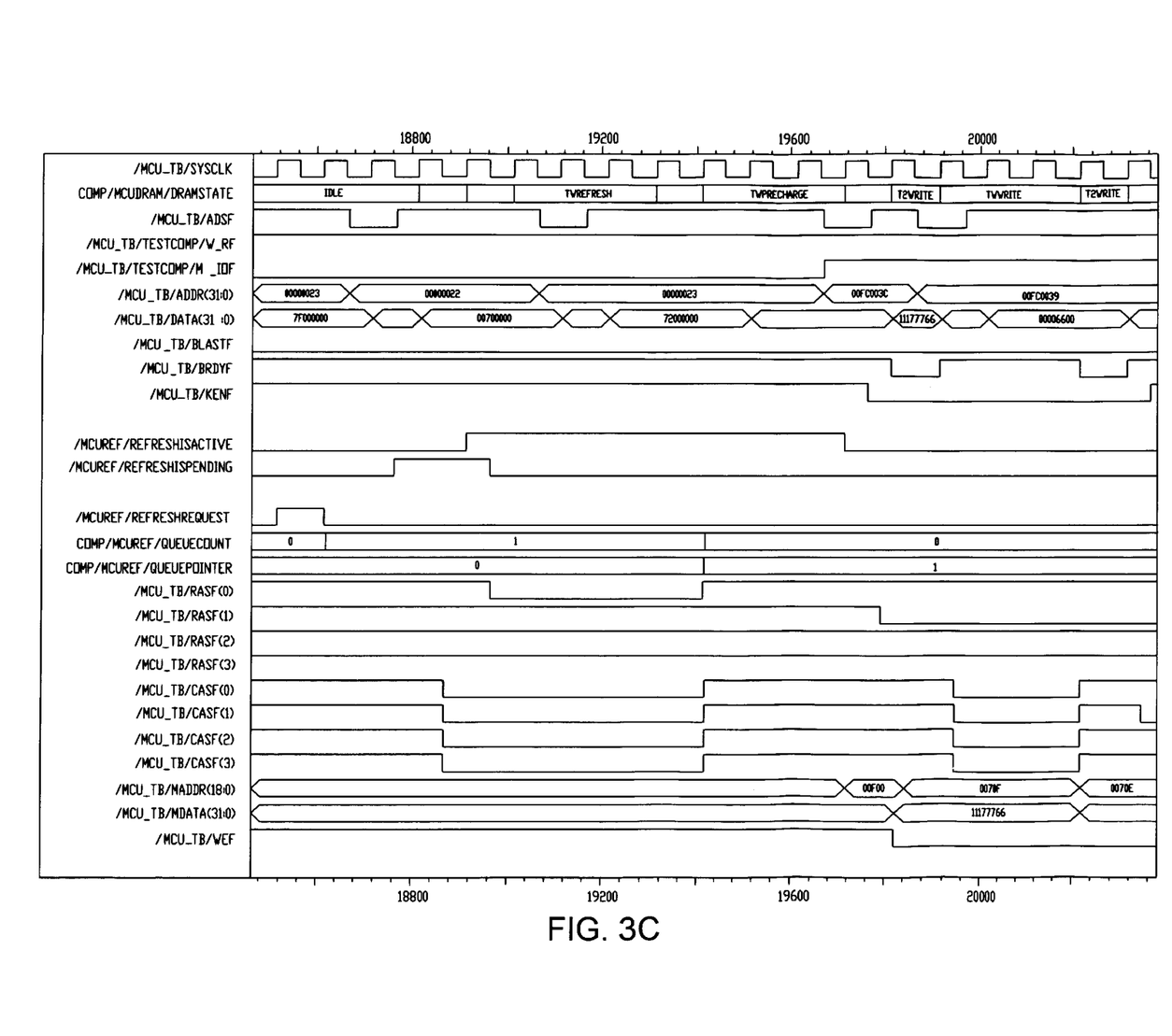

FIG. 3C illustrates a refresh cycle during an input/output access (M_IOF is low). A queue count is received, causing the queue counter to increment to 1. The queue pointer points to DRAM bank 0. The refresh active signal is asserted and the CAS lines are asserted low. The RAS(0) line is asserted low, with the refresh pending signal asserted low. When RAS(0) is deasserted, the queue pointer is indexed to bank 1, and the counter is decremented to 0. Subsequently, a DRAM write cycle ensues to DRAM bank 1.

Figure 4A:
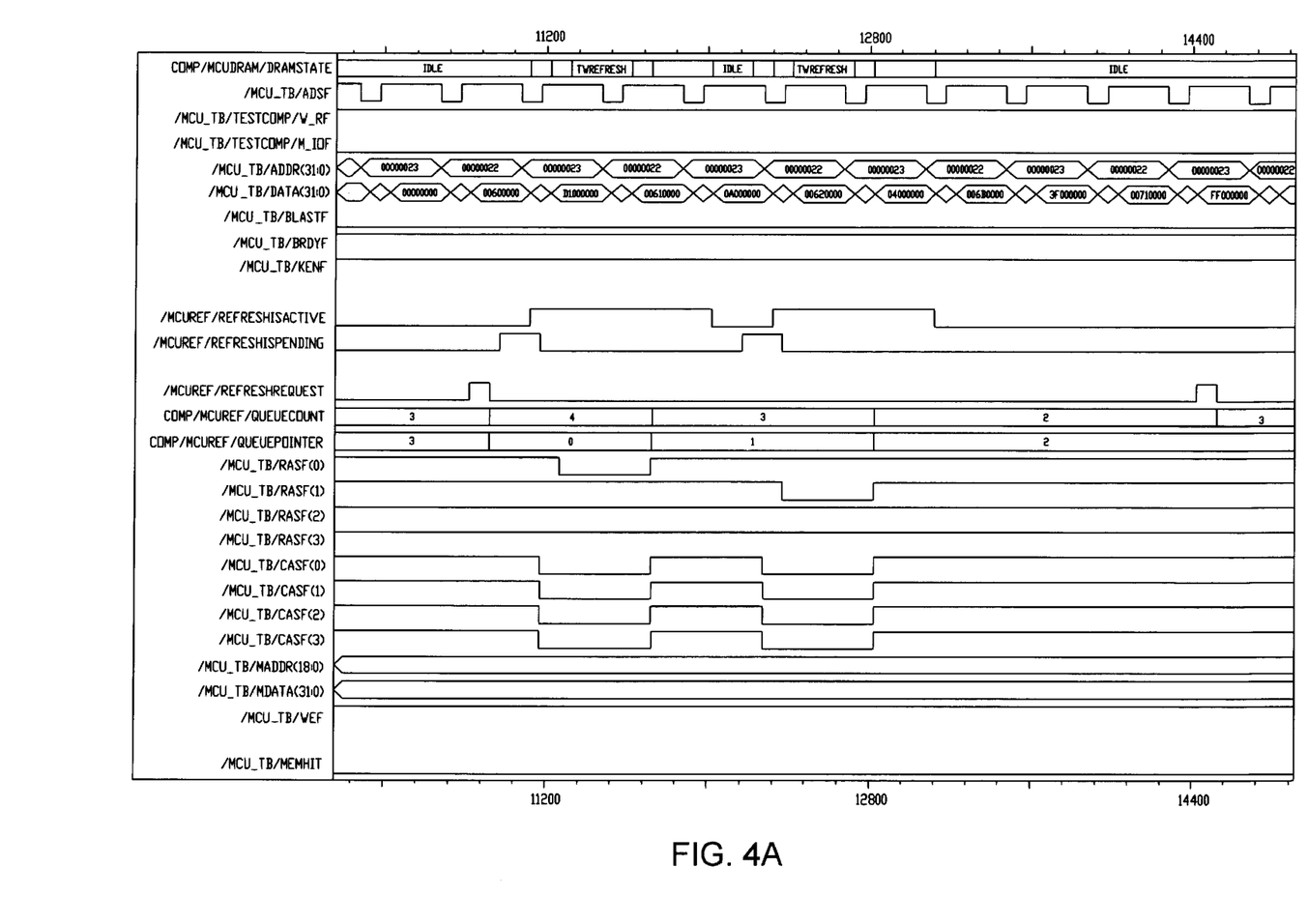
FIGS. 4A–4B are timing diagrams illustrating the operation of the MCU shown in FIG. 2, with two banks populated.

FIG. 4A shows a DRAM array with banks 0 and 1 populated and banks 2 and 3 not populated. The refresh queue is serviced during idle memory bus periods, and when the queue pointer points to a populated DRAM bank. Initially the pointer points to unpopulated bank 3, with a count of 4. When the refresh request is received, the queue counter increments and the queue pointer advances to bank 0. A refresh cycle ensues to bank 0, followed by a refresh cycle to bank 1.

Figure 4B:
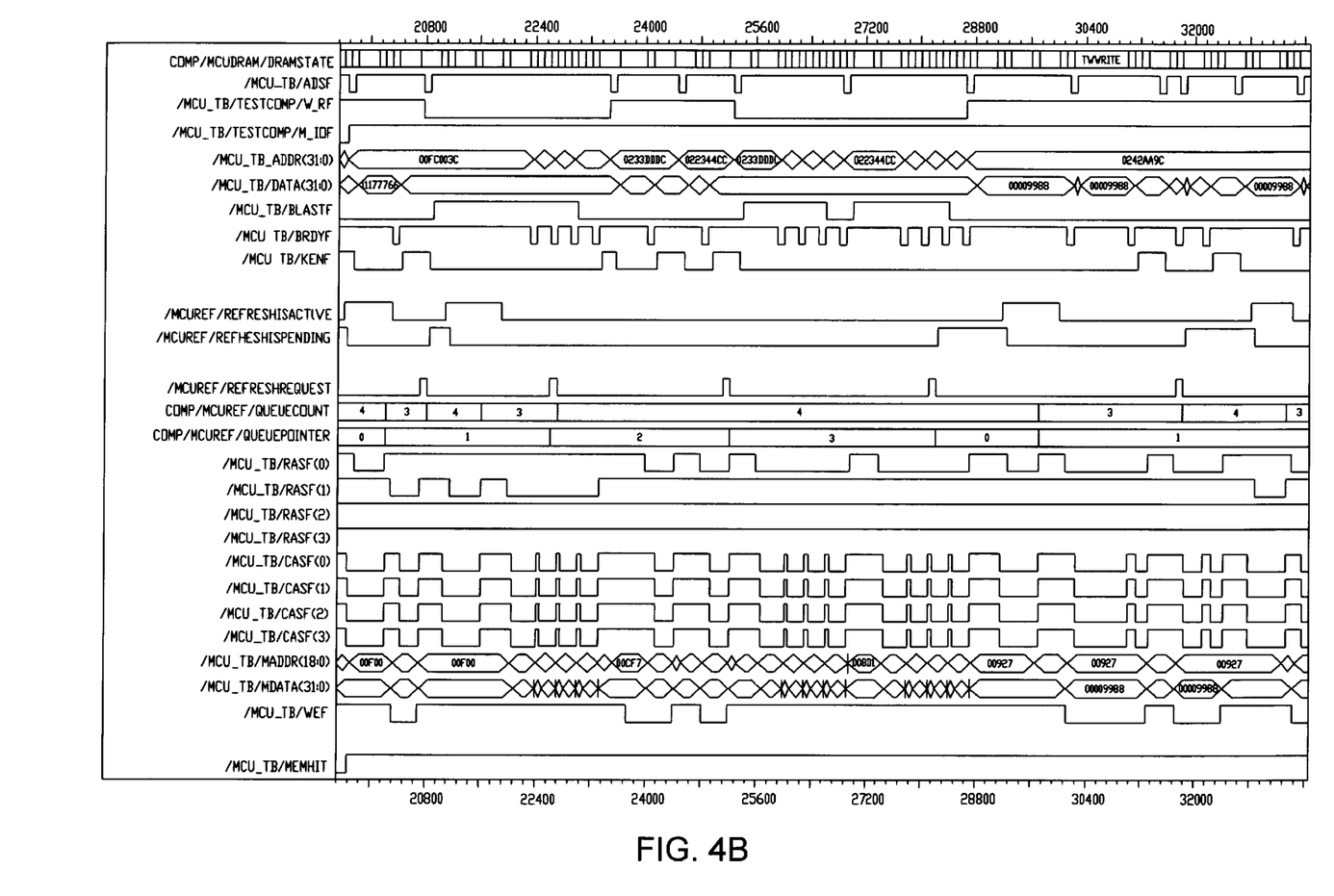

FIG. 4B also shows a DRAM array with only banks 0 and 1 populated. Initially, the queue pointer points to 0, and the queue counter is full, at 4. A refresh cycle (CAS before RAS) ensues. The counter then decrements to 3, and the pointer advances to bank 1. Shortly thereafter, a refresh request is received, incrementing the counter back to 4. The refresh active signal is asserted, and a refresh cycle ensues as the CAS lines are asserted, followed by the RAS(1) line. The counter decrements to 3, and the pointer indexes to bank 2, which is not populated. The refresh request advances the counter to 4. At each subsequent refresh request, the pointer indexes, without any refresh, until the pointer again points to bank 0, when a refresh cycle is initiated.

Thus, in summary, if a refresh cycle is pending in the queue counter 225, it is retired or serviced, if the memory controller unit 100 detects an IO cycle, or a non DRAM cycle in progress, or the memory bus is IDLE (no CPU accesses to memory). As a result, the refresh cycle is effectively hidden under a non DRAM cycle. The refresh attains higher priority only when all of the levels of the refresh request queue are full. Once the queue becomes full, the MCU 100 waits for the current DRAM access (if any) to complete. At that time, a refresh event is retired before any subsequent DRAM access is permitted. After the completion of the refresh cycle, the priority of the refresh is again minimized until the queue is again full. The refresh requests are continually retired during non-DRAM cycles.

Numerous variations and modifications will become apparent to those skilled in the art once the above disclosure is fully appreciated. Thus, while a preferred embodiment of the invention has been shown and described, modifications thereof can be made by one skilled in the art without departing from the spirit of the invention. It is intended that the following claims be interpreted to embrace all such variations and modifications.

What is claimed is:

1. A memory control unit for controlling memory transactions to a memory array having a plurality of memory banks via a memory bus, wherein the memory control unit comprises:

an address decoder configured to receive address signals and control signals from a CPU bus, configured to determine if a memory transaction is being requested, and configured to responsively provide a signal to control a write enable signal;

a memory controller operably coupled to the address decoder to receive a control signal indicative of a memory transaction request;

a signal generator coupled to the memory controller to receive an enable signal and configured to responsively generate memory control signals;

a memory address router configured to receive address signals from the CPU bus and configured to convert the bus address signals into memory row and column addresses;

a memory bus interface unit coupled to the address decoder to receive the write enable signal, coupled to the signal generator to receive the memory control signals, and coupled to the memory address router to receive the memory row and column addresses, wherein the memory bus interface unit is configured to provide the write enable signal, the memory control signals, and the memory row and column addresses on the memory bus, and wherein the memory bus interface unit is configured to transfer data between the memory bus and the CPU bus; and a refresh logic device coupled to the memory controller to receive an idle signal indicative of when the memory bus is inactive, wherein the refresh logic device is configured to receive a periodic refresh request signal, wherein the refresh logic device includes a queue counter which increments every time a refresh request is received and which decrements every time a refresh request is retired, wherein the refresh logic device is configured to assert a bank refresh signal if the memory bus is inactive and the queue counter has a nonzero value, wherein the refresh logic device is further configured to assert the bank refresh signal if the queue counter has a maximum value, and wherein the maximum value is greater than one.

2. The memory control unit of claim 1, wherein and the refresh logic device includes a bank pointer to indicate the bank to be refreshed, wherein the asserted bank refresh signal is indicative of the value of the bank pointer.

3. The memory control unit of claim 2, wherein the refresh logic device further includes a bank detection unit coupled to a configuration register which indicates populated memory banks, wherein the bank detection unit is configured to determine if the asserted bank refresh signal applies to a populated memory bank, wherein the bank detection unit is coupled to the signal generator to provide the asserted bank refresh signal if the asserted bank refresh signal applies to a populated memory bank.

4. The memory control unit of claim 3, further comprising a timer for providing, the periodic refresh request signal, wherein the timer is coupled to a divider circuit within the refresh logic device to provide a variable refresh request rate, and wherein the divider circuit is coupled to the configuration register to receive a divisor which determines the refresh request rate.

5. The memory control unit of claim 4, wherein the refresh logic device is coupled to provide a refresh active signal to the memory controller to indicate an active refresh cycle.

6. An integrated processor connectable to a memory array having a plurality of memory bank via a memory bus, wherein the memory array requires refreshing according to a predefined refresh rate, and wherein the integrated processor comprises:

a central processing unit (CPU) local bus;

a CPU core connected to the CPU local bus; and a memory control unit which includes:

an address decoder configured to receive address signals and control signals from a CPU bus, configured to determine if a memory transaction is being requested, and configured to responsively provide a signal to control a write enable signal;

a memory controller operably coupled to the address decoder to receive a control signal indicative of a memory transaction request;

a signal generator coupled to the memory controller to receive an enable signal and configured to responsively generate memory control signals;

a memory address router configured to receive address signals from the CPU bus and configured to convert the bus address signals into memory row and column addresses;

a memory bus interface unit coupled to the address decoder to receive the write enable signal, coupled to the signal generator to receive the memory control signals, and coupled to the memory address router to receive the memory row and column addresses, wherein the memory bus interface unit is configured to provide the write enable signal, the memory control signals, and the memory row and column addresses on the memory bus, and wherein the memory bus interface unit is configured to transfer data between the memory bus and the CPU bus; and a refresh logic device coupled to the memory controller to receive an idle signal indicative of when the memory bus is inactive, wherein the refresh logic device is configured to receive a periodic refresh request signal, wherein the refresh logic device includes a queue counter which increments every time a refresh request is received and which decrements every time a refresh request is retired, wherein the refresh logic device is configured to assert a bank refresh signal if the memory bus is inactive and the queue counter has a nonzero value, wherein the refresh logic device is further configured to assert the bank refresh signal if the queue counter has a maximum value, and wherein the maximum value is greater than one.

7. The integrated processor of claim 6, wherein said memory control unit further includes a bank detection unit and one or more configuration registers by which the memory control unit is programmed, wherein the one or more configuration registers are configured to indicate populated memory banks, wherein the bank detection unit is coupled to the one or more configuration registers to determine if the asserted bank refresh signal applies to a populated memory bank, wherein the bank detection unit is coupled to the signal generator to provide the asserted bank refresh signal if the asserted bank refresh signal applies to a populated memory bank.

8. The integrated processor of claim 7, further comprising a timer for providing the periodic refresh request signal, wherein the timer is coupled to a divider circuit within the refresh logic device to provide a variable refresh request rate, and wherein the divider circuit is coupled to the one or more configuration registers to receive a divisor which determines the refresh request rate.

* * * * *

UNITED STATES PATENT AND TRADEMARK OFFICE
CERTIFICATE OF CORRECTION

PATENT NO. : 5,873,114

DATED : February 16, 1999

INVENTOR(S) : Saba Rahman and Victor F. Andrade

It is certified that error appears in the above-identified patent and that said Letters Patent is hereby corrected as shown below:

Claim 4, col. 13, line 9, please delete the "," after "providing".

Claim 6, col. 13, line 20, please change "bank" to "banks".

Signed and Sealed this

Twenty-second Day of May, 2001

Attest:

NICHOLAS P. GODICI

Attesting Officer     *Acting Director of the United States Patent and Trademark Office*